United States Patent [19]
Graeber

[11] Patent Number: 5,861,787
[45] Date of Patent: Jan. 19, 1999

[54] REVERSE POWER PROTECTION CIRCUIT AND RELAY

[76] Inventor: Roger R. Graeber, 8191 Appian Way, Sebastopol, Calif. 95472

[21] Appl. No.: 876,272

[22] Filed: Jun. 16, 1997

Related U.S. Application Data

[62] Division of Ser. No. 609,151, Feb. 29, 1996, Pat. No. 5,684,441.

[51] Int. Cl.$^6$ ............................................. H01H 1/66
[52] U.S. Cl. ............................................. 335/154; 361/18
[58] Field of Search ............................ 335/4, 5, 151, 335/154, 78–86; 333/103–5; 361/18, 42, 54–56, 58, 77, 86, 88, 91, 111, 113, 119; 340/653, 654, 658–9, 660–2; 324/521–2

[56] References Cited

U.S. PATENT DOCUMENTS

| | | | |
|---|---|---|---|
| 5,198,697 | 3/1993 | Loth | 307/31 |
| 5,258,731 | 11/1993 | Zemke | 335/4 |
| 5,381,297 | 1/1995 | Weber | 361/169 |
| 5,684,441 | 11/1997 | Graeber et al. | 335/4 |

*Primary Examiner*—Lincoln Donovan

[57] ABSTRACT

A relay for high frequency instruments and a reverse power protection circuit for high frequency instruments are described herein. The relay is inexpensive to construct, permits good impedance matching up to approximately 5 GHz, and can be easily mounted on a coplanar waveguide transmission line. The circuit can open the relay in response to a reverse power condition in as little as 8 microseconds and provides both good grounding and functions reliably up to 4 GHz.

3 Claims, 5 Drawing Sheets

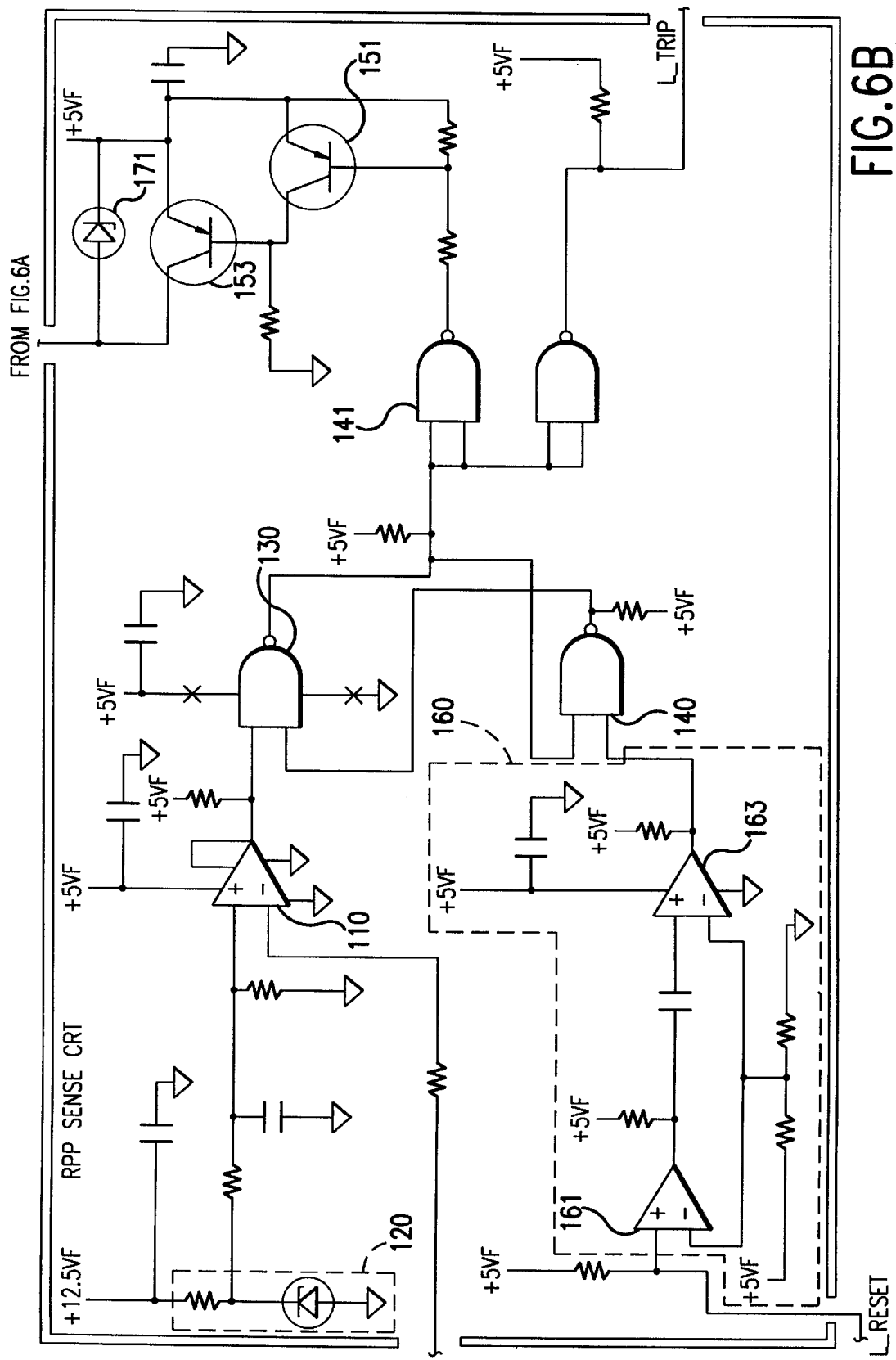

REVERSE POWER PROTECTION CIRCUIT AND RELAY

This is a divisional of copending application Ser. No. 08/609,151 filed on Feb. 29, 1996, now U.S. Pat. No. 5,684,441.

BACKGROUND OF THE INVENTION

This invention relates to circuits and devices for protecting radio frequency ("RF") instruments from accidental injection of high power RF signals. In particular, the present invention is a reverse power protection ("RPP") limiter/detector circuit and relay. The relay mounts easily on a printed circuit board ("PCB") and operates reliably up to approximately 5 GHz. The RPP limiter/detector circuit functions well up to 4 GHz.

RF instruments such as signal generators, spectrum analyzers, network analyzers, and measuring receivers may be exposed to high power RF signals of 50 W or more if such signals are accidentally applied to the instruments' external signal port. The sensitive internal circuitry of these instruments can be damaged when exposed to such high power signals. To protect the internal circuitry, RPP limiter/detector circuits and relays are used.

Typically, limiting diodes coupled to the external signal port as shunts with a predetermined bias voltage, permitting nominal signal levels in a forward direction but limiting any reverse signal input to the predetermined voltage level. The size of the diodes is limited by the need to match impedances along the signal path, thereby minimizing signal reflection and resulting signal degradation over the operating frequency range. Small diodes have only a small capacitance and therefore affect the overall impedance of the circuit less. Given their small size, these diodes can only protect the internal circuitry from high power signals for a short time. After this short time, the diodes fail, exposing the instrument to the high power RF signal.

To increase the protection of the RF instrument's internal circuitry, a relay is placed in the signal path between the RF output connector and the limiting diodes. Normally, the relay is closed, allowing signals to flow in either direction. In response to the injection of a reverse power signal above a predetermined threshold, the relay is triggered open by an RPP limiter/detector circuit. The open relay saves the limiting diodes and internal circuitry from damage.

The limiting diodes provide an interim time period for protecting the internal circuitry while the reverse power surge is detected by the RPP limiter/detector circuit and the relay switched open. The diodes, the relay and its coupling capacitors, and RPP limiter/detector circuit must together closely match the impedance of the RF instrument to avoid signal reflection and related signal degradation during normal operation.

Known RPP limiter/detector circuits and relays use microstrip transmission lines for both the diodes and transmission line structures. The series inductance created by the lengthy connection between the surface mounted diodes and the ground plane makes the upper frequency limit of these printed circuit microstrip designs approximately 3.5 Ghz. To fabricate RPP limiter/detector circuits that will work at frequencies above 4 Ghz, the path length to ground must be reduced. This has previously been accomplished by using thin circuit material and a microcircuit design with the diode chip bonded onto the microstrip. Such microcircuits are typically more expensive than PCBs and are only used when the desired performance can not be achieved any other way. Even the best known RPP limiter/detector circuits and relays using thick film microcircuits and wire bonds perform relatively poorly above 2 GHz, providing reduced power protection at these higher frequencies, and doing so at relatively high cost.

SUMMARY OF THE INVENTION

A first preferred embodiment of the present invention comprises a low cost coaxial relay and a very fast RPP limiter/detector circuit. The relay comprises a glass reed switch, elastomeric conductive tube, outer metal ground shield, magnetic coil and bobbin assembly, and outer housing. The ground shield provides very low impedance connections to the ground planes used in the present invention and the entire relay can be assembled for a much lower cost than known coaxial relays. The RPP limiter/detector circuit that the relay is coupled to can sense a reverse power signal very quickly and can open the coaxial relay within 8–10 microseconds("$\mu$secs") of the application of the reverse power signal. The use of a high voltage zener diode and high voltage transistors in the RPP limiter/detector circuit enable this fast response time.

The present invention will be discussed with reference to the figures listed and described below.

BRIEF DESCRIPTION OF THE DRAWINGS

FIGS. 6A and 6B are a schematic drawings of the RPP circuit used in the present invention.

DETAILED DESCRIPTION OF THE PREFERRED EMBODIMENT

The Relay

Figure 3:
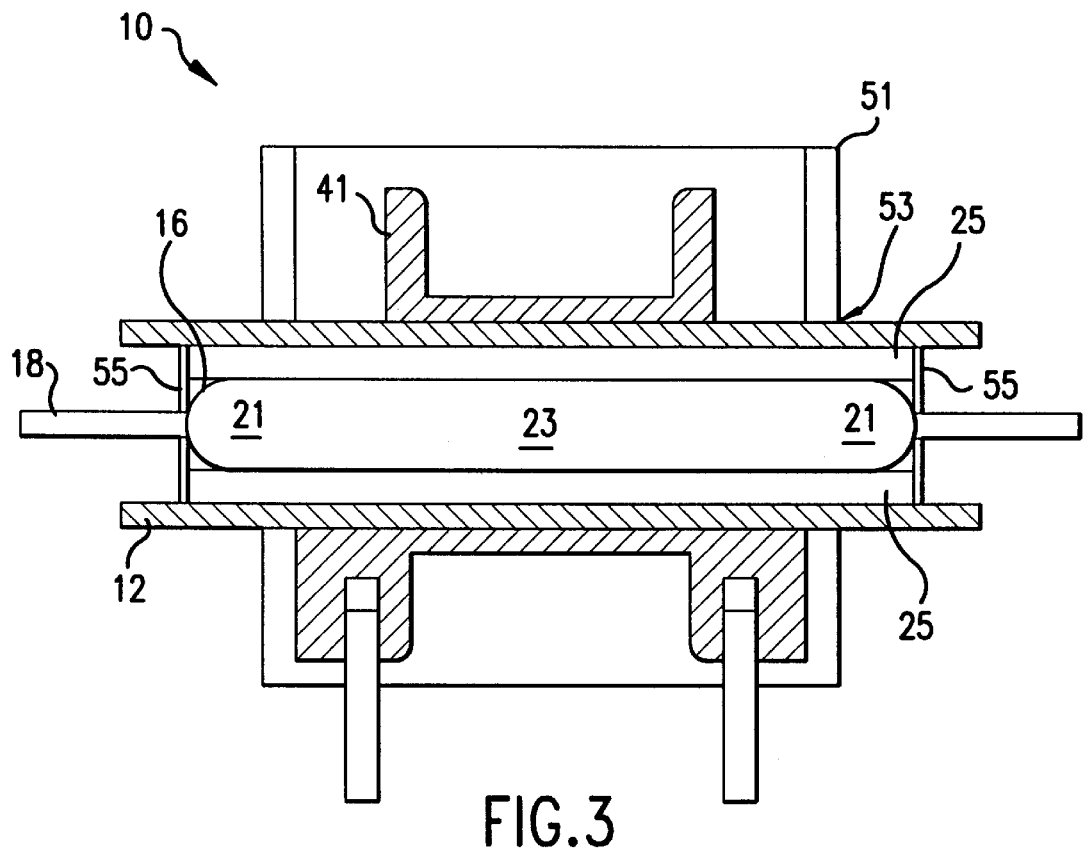
FIG. 3 is a side cross-sectional view of the present invention's completed relay.

Coaxial relay 10 (see FIG. 3) described herein is a low cost relay with a match of 20 dB return loss and a 1.22:1 VSWR up to and beyond 4 GHz. Relay 10 maintains the characteristics of a 50 $\Omega$ transmission line up to and beyond 4 GHz when surface mounted on a PCB. When coupled to RPP limiter/detector circuit 100 (see FIG. 6), relay 10 can be opened in as little as 6 microseconds ("$\mu$s")

Figure 1A:
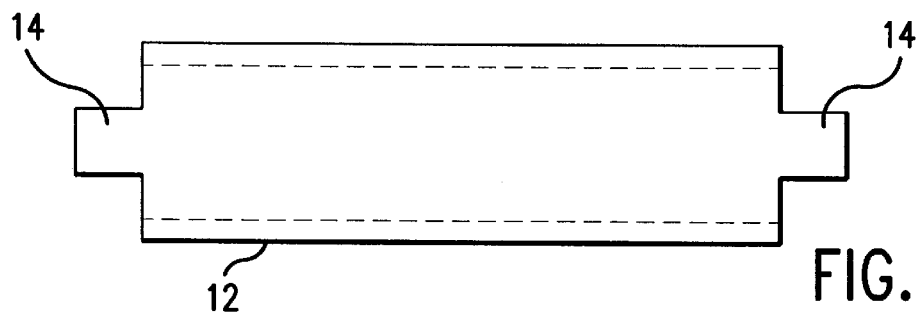
FIGS. 1a and 1b are, respectively, a side and a cross-sectional view of the metal tube used in the present invention's relay.

To obtain these performance characteristics, the outer shield connection of relay 10 must be carefully matched to the PCB. A low inductance connection between outer shield 12 (see FIG. 1a) of relay 10 is enabled by extending 2 shield contacts 14 from each end of relay shield 12. These are soldered directly to the PCB.

At least one known relay wrapped a foil shield around the glass reed switch used to open and close the relay. The foil left air gaps around the solid glass ends of the reed switch, resulting in impedance variations among different relays. This was partially solved by the use of an elastomeric conductive tube in place of the foil shield, as taught in U.S. Pat. No. 5,258,731 ("'731"). Previously known PCB relays also had a long lead at each end for the coaxial ground connection. The increased ground impedance caused by the long leads resulted in performance degradation above 2 Ghz.

Relay 10 (see FIG. 3) is formed by creating a stepped impedance, low pass filter structure. Reed switch 16 is formed so that reed switch wire 18 is fully encased in glass at both ends of reed switch 16. In the middle of reed switch 16, the contacts are surrounded by air. Sections 21, where reed switch wire 18 is encapsulated by glass, form a low impedance transmission line. Section 23, where reed switch wire 18 is surrounded by air, forms a high impedance transmission line. Thus reed switch 16 has a low impedance section 21, a high impedance section 23, and a second low impedance section 21. This series of sections forms a low pass filter.

The impedance value of low impedance sections 21 must be consistent from one relay to the next. Therefore, as in the '731 patent, conductive elastomer tube 25 is used to cover glass reed switch 16. Tube 25 conforms to switch 16 and minimizes any potential air gaps, creating a consistent outer shield diameter, which results in a consistent impedance value.

Figure 1B:
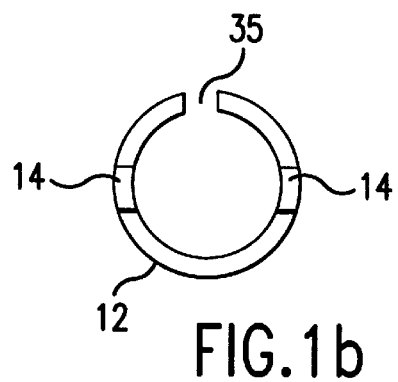
Figure 2:
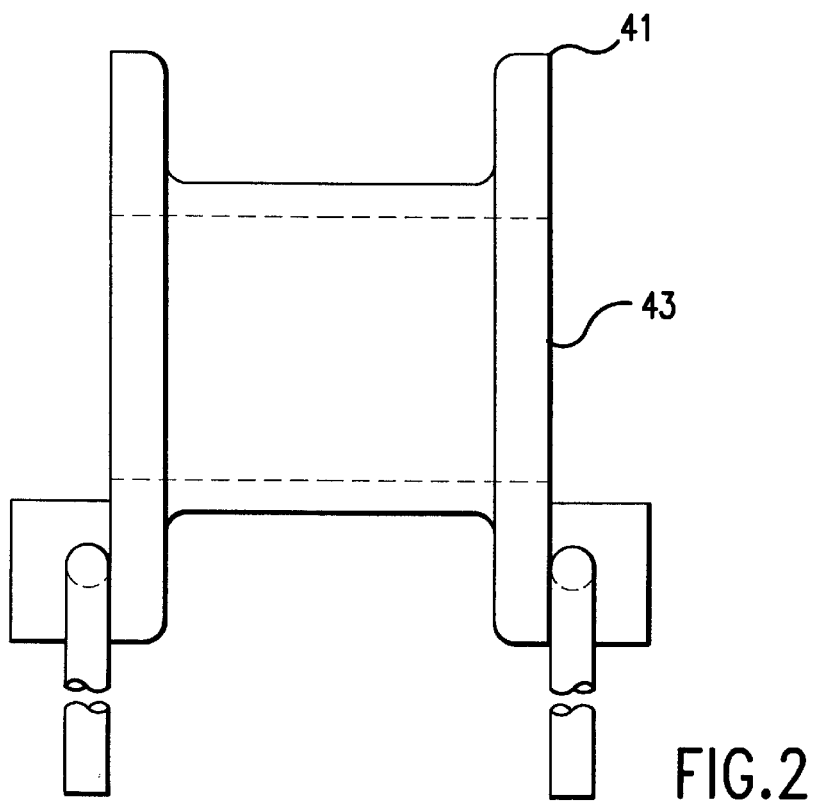
FIG. 2 is a side cross-sectional view of the bobbin used in the present invention's relay.

To assemble the relay, metal tube 12 (see FIGS. 1a and 1b) is formed from brass and tin plated with two ground contacts 14 at both ends of tube 12. Slot 35 is cut through the length of tube 12 and prevents tube 12 from becoming a shorted turn, preventing current flow in tube 12 and reducing the opening time of the completed relay. In the absence of current flow, the magnetic field which holds the contact wires together cannot be maintained, and the relay opens. Elastomer tube 25 (see FIG. 3), substantially identical to that described in the '731 patent, is placed within tube 12. Glass reed switch 16 is then pressed into the combined assembly of metal tube 12 and elastomer tube 25. A magnetic coil and bobbin assembly 41 (see FIGS. 2 and 3) is then placed inside a plastic housing 51. The combination of reed switch 16, elastomer tube 25, and metal tube 12 is passed through a hole 53 in plastic housing 51 and through a hole 43 in bobbin 41 until it is centered in the housing/bobbin assembly. The completed assembly is then encapsulated using a known epoxy compound to prevent the various components from shifting in position. To complete the assembly of the relay, thin insulating washers 55, made from kapton, are placed over each end of elastomeric tube 25 to prevent tube 25 from shorting out to the center conductor of the PCB coplanar conductor (see FIG. 4). This conductor must be extended as close to the relay as possible, to minimize the inductance of the connection between the relay and the conductor.

Completed relay 10 costs roughly $7.00 in volume production, which contrasts with the $130.00 cost of the '731 relay, provides a very good 50 Ω impedance match up to at least 5 GHz with a 20 dB return loss, and can be surface mounted on a PCB. The finished relay's package height is also critical to its proper functioning. By keeping the height to within a predetermined height above and below the PCB, the creation of undesired modes within the relay's pass band is eliminated. The two ground contacts 14 allow for good ground contact and a good impedance match between the PCB and relay 10. Equally important, they facilitate balancing the electromagnetic field at either side of the coplanar waveguide.

The Reverse Power Protection Limiter/Detector Circuit

Figure 4:
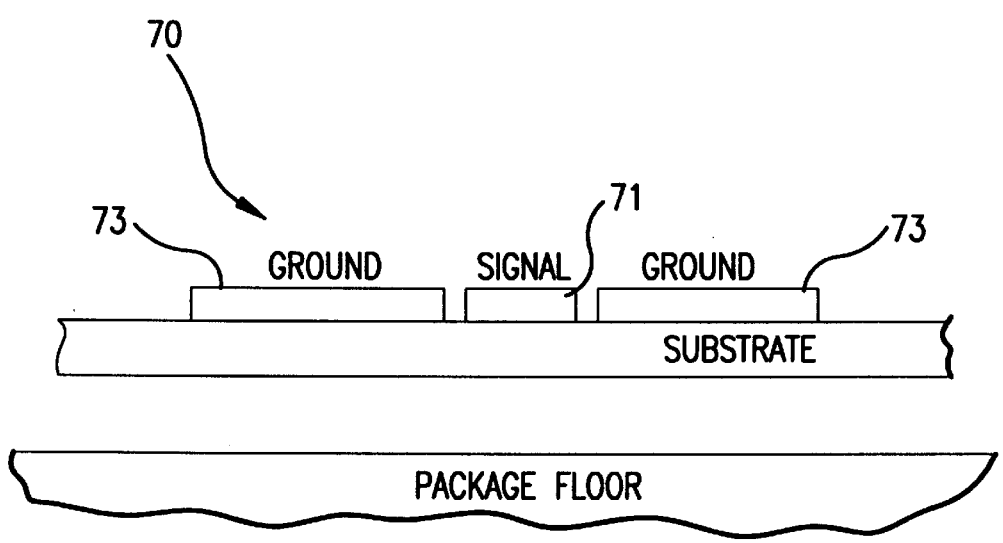
FIG. 4 cross-sectional view of a coplanar waveguide transmission line.

FIG. 4 is a side view of a coplanar waveguide transmission line 70 constructed with a center conductor 71 surrounded by 2 ground planes 73. The coplanar waveguide transmission line shown in FIG. 4 is known and similar to that used in the present invention.

Figure 5:
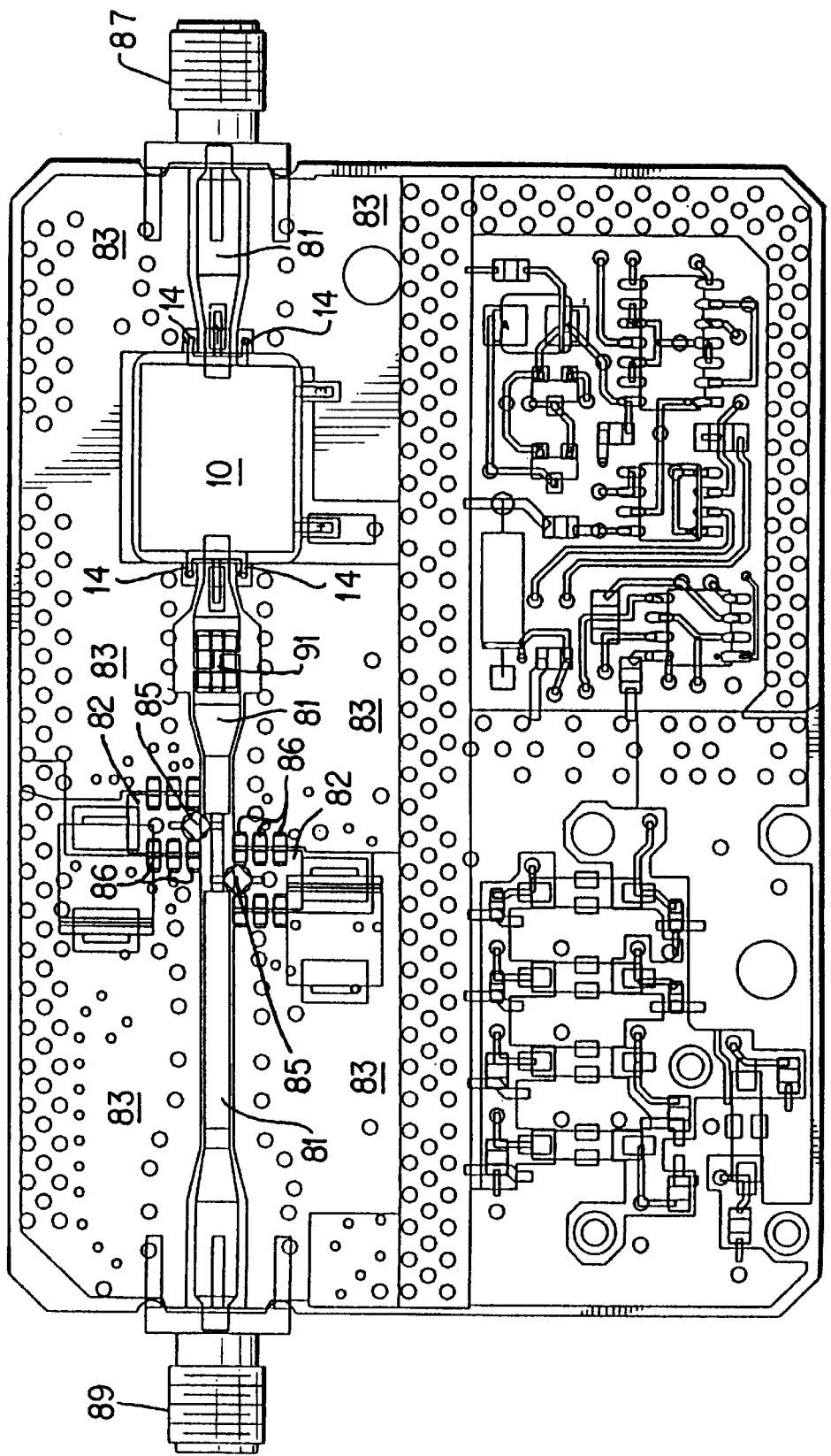
FIG. 5 is a top plan view of the coplanar waveguide and PCB assembly used in the present invention.

FIG. 5 illustrates the coplanar waveguide transmission line and portions of the RPP limiter/detector circuit used in the present invention. In known PCB fabrication processes, the conductive material is etched and then plated up. To obtain the desired performance in the present invention, much tighter process controls are used in the fabrication of the PCB than have been typically used before. This permits much tighter tolerances. In the preferred embodiments, the width of the conductor and ground planes can be controlled to within +/−½ mill and the trace thickness and the spaces between the ground planes and traces can be controlled to within +/−3/10 mill. Conductor 81 has RF connectors 87 and 89 at its respective ends. The distance between ground planes 83 and conductor 81 varies along its length. Between connector 87 and relay 10, the distance narrows from 19 mills at connector 87 to 12 mills at relay 10. Between grounding patches 82 and conductor 81, the distance is 11.5 mills.

Diodes 85 are coupled between central conductor 81 and ground planes 83 in a reverse bias configuration so that they do not conduct under normal conditions and affect the signal output. The capacitance of diodes 85 must be matched to that of the transmission line to maintain proper impedance matching. Making the diode capacitance part of a low pass filter structure is one way of facilitating this matching process. Also, the length of the connection between the conductor and ground including the diode path length must also be kept as short as possible to minimize parasitic impedances. Given these constraints, diodes 85 must be AC coupled to ground planes 83. The AC connection must provide a good ground connection up to at least 4 GHz, and preferably up to 5 GHz.

Grounding patch 82 on both sides of conductor 81 are isolated from the rest of ground planes 83. Patches 82 must be kept as small as possible to avoid the propagation of undesirable modes. A plurality of capacitors 86, capacitors 86 having different values, are coupled between grounding patches 82 and ground planes 83. Capacitors 86 vary in value from 51 picofarad("pF") to 680 pF. Each grounding patch also has a slightly different total capacitance value coupling it to ground planes 83, to minimize any resonances associated with the capacitors and the propagation of undesired modes. The smaller valued capacitors provide high frequency grounding and the larger valued capacitors provide low frequency grounding. The exact values of the capacitor can be varied as necessary for different frequency ranges. Grounding patches 82 are also not directly across from one another. Known methods are used to calculate the necessary lateral distance. Also, as the grounding patches themselves add resonance to the RPP circuit, grounding patches 82 are kept as small as possible.

Additional AC grounding between grounding patches 82 and ground planes 83 is provided by adding ground layers (not illustrated) in other inner layers of the PCB. Many vias are added to couple all the additional ground layers and ground planes 83 together. After that coupling occurs, grounding patches 82 comprise a parallel plate capacitor formed with ground planes 83 on the second layer of the PCB. This combination of ground planes and vias provides an excellent ground at frequencies up to 4 GHz.

Relay 10's ground contacts 14(see FIGS. 1a and 5) are attached directly to ground planes 83 without the use of vias. In known reverse power protection circuits, narrow contact strips couple the relay's ground connections to the microstrip transmission line. These contact strips added inductance and limit the high frequency performance of the circuit. In the present invention, the direct coupling of the relay to the ground planes introduces less inductance and improves high frequency performance.

To prevent ground imbalances and modes occurring between the ground planes of the coplanar waveguide transmission line, narrow straps(not illustrated) on the back side of the circuit board couple the ground planes together.

Figure 6A:
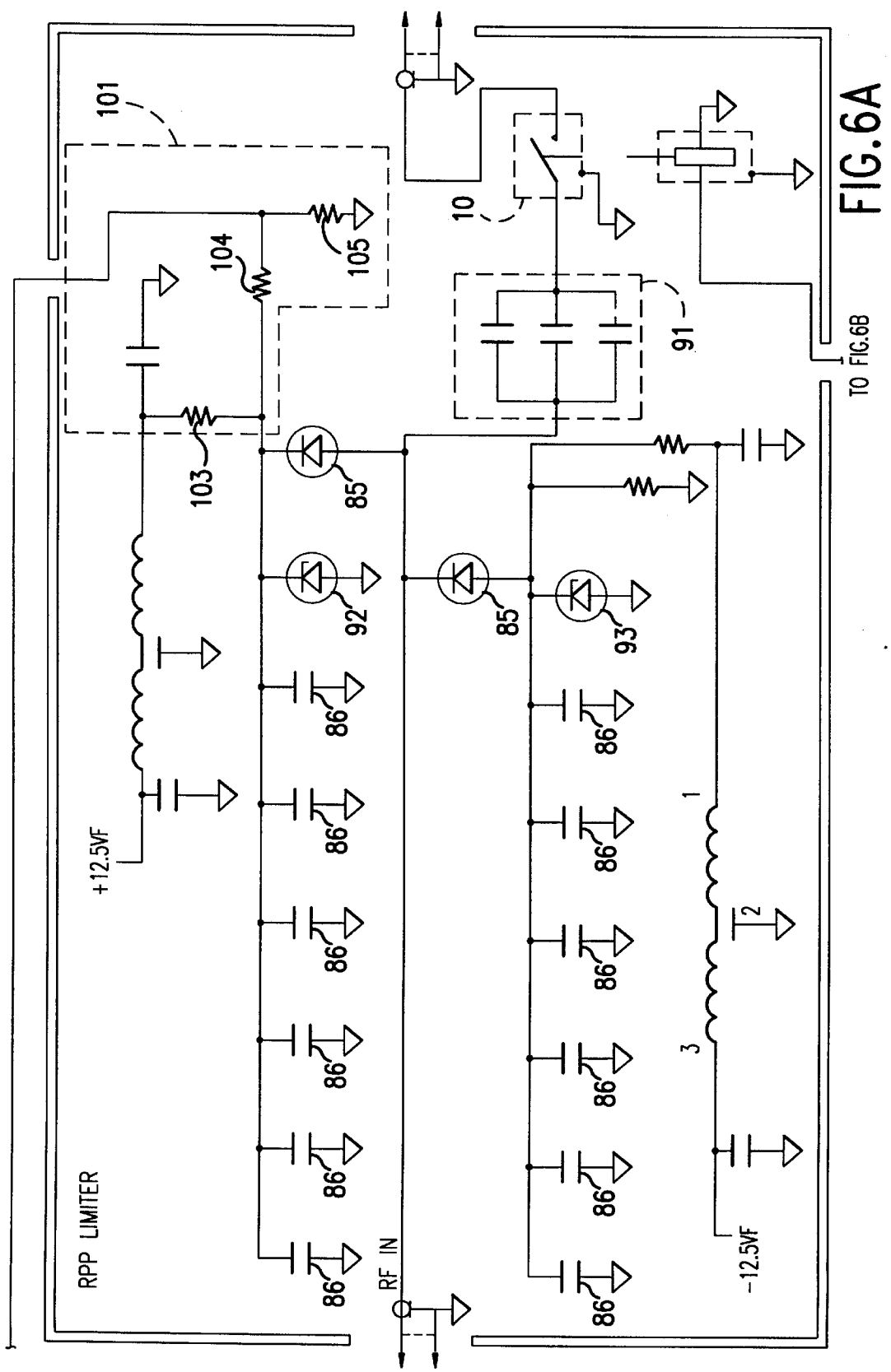

The connection between SMA coaxial connectors 87 and 89 and the PCB of the present invention also have reduced inductance when compared to the known art as the outer conductor of the coaxial connector is coupled directly to the ground planes. As shown in FIGS. 5 and 6, capacitors 91 couple the sections of conductor 81 between relay 10 and diodes 85 together. They function as DC blocking capacitors and allow a higher DC voltage to be applied to the input of the RPP limiter/detector circuit without causing the circuit to trip. In this embodiment, capacitors 91 are mounted on their sides for proper impedance matching.

Referring now to FIG. 6, during normal operation relay 10 is closed and an output signal travels from RF_IN to RF_OUT. In a reverse power situation, when the signal level on the RF_OUT line reaches 6.2 V, peak diodes 85 begin to conduct, raising the voltage across transient absorbers ("Transorbs") 92 and 93. Transorbs 92 and 93 and diodes 85 limit the incoming reverse power waveform to +/−7.7 V. They can absorb up to 600 W for 1 millisecond. The bias point on transorbs 92 and 93 is set as high as possible. This speeds up the circuit and increases the protection level by pre-charging the capacitance of transorbs 92 and 93.

As the voltage across transorbs 92 and 93 increases, voltage divider 101, comprised of resistors 103, 104, and 105, generates an output voltage signal, which is applied to the negative input of comparator 110. In this embodiment, only the positive side of the reverse power signal is used to provide an input to the RPP limiter/detector circuit. In other embodiments, a similar peak detector could be used to detect the negative side of the reverse power signal exclusively, or both sides of the reverse power signal could be detected by having both a positive and negative peak detector. Circuit 120 provides a temperature compensated very stable voltage threshold signal to the positive input of comparator 110. As the output voltage signal from voltage divider 101 increases above the threshold voltage supplied by circuit 120, comparator 110 senses the increase and, when it exceeds the threshold voltage, generates a low output. The threshold voltage of comparator 110 is set above the bias voltage on transorbs 92 and 93. The higher the bias voltage on transorbs 92 and 93, the more they can be pre-charged, which provides better electro-static discharge ("ESD") protection. The output of comparator 110 is applied to a set-reset flip-flop made up of NAND gates 130 and 140. When the output of the flip-flop goes high, the output of NAND gate 141 goes low. This in turn turns transistor 151 on, which turns off transistor 153. Turning off transistor 153 stops current flow through the coil of relay 10, which then opens. Zener diode 171, which has a very high threshold voltage of 160 V, allows relay 10 to open very quickly. The more energy that is absorbed in diode 171's electric field, the less current is available to flow into relay 10's magnetic coil. As the current is reduced, the magnetic field weakens, allowing the contacts to open faster. The entire process, from the time the signal level increases to the time that the relay contacts open, requires 8–10 μsecs. During the time it takes for the relay to open transorbs 92 and 93 limit the amplitude of the reverse power signal. One-shot reset circuit 160 is comprised of comparators 161 and 163. Once relay 10 has been opened, a reset signal must be received by the RPP limiter/detector circuit on reset line 170 to close relay 10 again. If the reverse power signal that caused relay 10 to open is still present, one-shot reset circuit 160 allows the RPP limiter/detector circuit to re-open relay 10, even if the reset signal is continuously asserted. One-shot reset circuit 160 feeds only one narrow pulse to the set-reset flip-flop of the RPP limiter/detector circuit each time the reset signal is asserted.

The present invention has shown lower insertion loss, higher frequency response, and better impedance matching over known microstrip transmission line printed circuit designs. The present invention also protects against higher levels of reverse power than known circuits. The present invention has exhibited better than 20 dB return loss(1.22:1 VSWR) at frequencies up to 4 GHz.

What is claimed is:

1. A reverse power protection circuit comprising:

a first and second reverse biased diodes coupled respectively between a signal line and a first and second AC grounding patch;

a first and second plurality of capacitors coupled between the AC grounding patch and a first and second ground plane;

a first and second transient absorber coupled respectively between the AC grounding patch and the ground plane;

a resistive voltage divider network coupled to at least one of the AC grounding patches and a first comparator, the first comparator having a predefined voltage trigger threshold;

a flip-flop circuit for providing a logic signal output when the threshold of the first comparator is exceeded;

a first transistor coupled through an inverter to the flip-flop circuit, the first transistor acting as a switch and changing state in response to the logic signal output of the flip-flop circuit;

a second transistor coupled to the first transistor, the second transistor acting as a switch and changing state in response to the first transistor's changing state; and a relay having an input and output, the relay being opened and closed by the de-energizing and energizing of a electromagnetic coil in the relay, the coil being de-energized when the second transistor changes state.

2. The reverse power protection circuit of claim 1 wherein a one-shot circuit is coupled to the flip-flop circuit, the one-shot circuit preventing the flip-flop circuit from oscillating after it is first triggered if a reverse power signal is being received when a reset signal is applied to the reverse power protection circuit.

3. The reverse power protection circuit of claim 1 wherein the second transistor further comprises a high voltage transistor and a high voltage zener diode coupled in parallel across the high voltage transistor, the combination decreasing the time required to open the relay.

* * * * *